United States Patent
Ho

(10) Patent No.: US 12,143,068 B2
(45) Date of Patent: Nov. 12, 2024

(54) ENVELOPE TRACKING SYSTEM FOR DYNAMICALLY ADJUSTING GAIN COMPRESSION OF POWER AMPLIFIER IN RESPONSE TO NUMBER OF ACTIVE RESOURCE BLOCKS IN CHANNEL BANDWIDTH, ASSOCIATED ENVELOPE TRACKING METHOD, AND ASSOCIATED ENVELOPE TRACKING SUPPLY MODULATOR CIRCUIT

(71) Applicant: MEDIATEK INC., Hsin-Chu (TW)

(72) Inventor: Chen-Yen Ho, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 57 days.

(21) Appl. No.: 17/992,913

(22) Filed: Nov. 22, 2022

(65) Prior Publication Data

US 2023/0179149 A1  Jun. 8, 2023

Related U.S. Application Data

(60) Provisional application No. 63/286,123, filed on Dec. 6, 2021.

(51) Int. Cl.
*H04K 1/02* (2006.01)
*H03F 1/02* (2006.01)
(Continued)

(52) U.S. Cl.
CPC .......... *H03F 1/0227* (2013.01); *H03F 3/245* (2013.01); *H03F 2200/102* (2013.01); *H03F 2200/451* (2013.01)

(58) Field of Classification Search
CPC .. H03F 1/0227; H03F 3/245; H03F 2200/102; H03F 2200/451; H03G 3/001
(Continued)

(56) References Cited

U.S. PATENT DOCUMENTS 10,250,194 B2   4/2019   Pratt
10,938,351 B2   3/2021   Khlat
(Continued)

FOREIGN PATENT DOCUMENTS

| CN | 104124930 B | 4/2017 |
|---|---|---|
| CN | 108347226 A | 7/2018 |
| EP | 3 413 461 B1 | 2/2020 |

OTHER PUBLICATIONS

Paek, An 88%-Efficiency Supply Modulator Achieving 1.08μs/V Fast Transition and 100MHz Envelope-Tracking Bandwidth for 5G New Radio RF Power Amplifier, ISSCC 2019/ Session 15/ Power for 5G, Wireless Power, and GAN Converters/ 15.1, pp. 238-239 and a page including Figure 15.1.7 ,2019.

*Primary Examiner* — Phuong Phu
(74) *Attorney, Agent, or Firm* — Winston Hsu

(57) ABSTRACT

An envelope tracking system includes an envelope tracking digital baseband (ETDBB) circuit, a digital-to-analog converter circuit, and an envelope tracking supply modulator (ETSM) circuit. The ETDBB circuit performs envelope detection upon a transmit (TX) baseband signal to generate an envelope detection result, and generates a digital envelope input according to the envelope detection result. The digital-to-analog converter circuit converts the digital envelope input into a supply envelope signal. The ETSM circuit generates a modulated supply voltage according to the supply envelope signal, and outputs the modulated supply voltage to a power amplifier. At least one of the ETDBB circuit and the ETSM circuit dynamically adjusts gain compression (GC) of the PA in response to a number of active resource blocks (RBs) in a channel bandwidth.

20 Claims, 6 Drawing Sheets

(51) Int. Cl.
  *H03F 3/24* (2006.01)
  *H04L 25/03* (2006.01)
  *H04L 25/49* (2006.01)

(58) Field of Classification Search
  USPC .............................. 375/296, 297, 260, 261
  See application file for complete search history.

(56) References Cited

U.S. PATENT DOCUMENTS

| | | |
|---|---|---|
| 2013/0187711 A1 | 7/2013 | Goedken |
| 2018/0034416 A1 | 2/2018 | Duncan |
| 2018/0234060 A1 | 8/2018 | Langer |
| 2020/0099343 A1* | 3/2020 | Khesbak ................ H03G 3/001 |
| 2020/0259456 A1 | 8/2020 | Khlat |

* cited by examiner

ENVELOPE TRACKING SYSTEM FOR DYNAMICALLY ADJUSTING GAIN COMPRESSION OF POWER AMPLIFIER IN RESPONSE TO NUMBER OF ACTIVE RESOURCE BLOCKS IN CHANNEL BANDWIDTH, ASSOCIATED ENVELOPE TRACKING METHOD, AND ASSOCIATED ENVELOPE TRACKING SUPPLY MODULATOR CIRCUIT

CROSS REFERENCE TO RELATED APPLICATIONS

This application claims the benefit of U.S. Provisional Application No. 63/286,123, filed on Dec. 6, 2021. The content of the application is incorporated herein by reference.

BACKGROUND

The present invention relates to envelope tracking, and more particularly, to an envelope tracking system for dynamically adjusting gain compression of a power amplifier in response to the number of active resource blocks in a channel bandwidth, an associated envelope tracking method, and an associated envelope tracking supply modulator circuit.

A power amplifier (PA) is used to amplify a radio-frequency (RF) signal for radio transmission. The PA is commonly found in a wireless communication device for driving antenna(s) of a transmitter. The power consumption of a PA is critical to a wireless communication device that is battery operated. Traditionally, the PA is biased with a fixed supply voltage. Peak RF output power conditions generally occur when the RF input signal input to the PA is at a maximum level. However, when the PA is backed-off from the peak RF output power conditions, the excess input power must be dissipated by the PA because it is not being transformed into useful RF output power. That is, the traditional fixed PA supply voltage results in significant amount of power loss as heat. Envelope tracking is a technique that requires the supply voltage of the PA to be modulated dynamically with the envelope of the RF input signal. This would make the PA operate closer to the peak level at all times and dramatically improve the efficiency of the PA. That is, the envelope tracking technique modulates the PA supply voltage to track the envelope of the RF input signal for reducing the amount of power dissipated as heat.

In 4G-LTE/5G-NR wireless communications, the channel bandwidth is getting wider. Different channel bandwidths may support different maximum numbers of resource blocks (RBs). Taking 4G-LTE for example, the smallest modulation structure is the resource element, where a resource element may be one 15 kHz subcarrier by one symbol; and resource elements are aggregated into resource blocks, where a resource block has dimensions of subcarriers by symbols, such as twelve consecutive subcarriers in the frequency domain and six or seven symbols in the time domain. The transmission bandwidth is the number of active RBs in a transmission. It is possible that the transmission bandwidth may occupy only a part of the channel bandwidth. That is, it is possible that only some of the RBs available in the channel bandwidth are actually used for transmission. Since the frequency of using low-RB (<6 RB) for transmission becomes higher, the efficiency enhancement for the PA in a low-RB TX case becomes a major system design concern.

SUMMARY

One of the objectives of the claimed invention is to provide an envelope tracking system for dynamically adjusting gain compression of a power amplifier in response to the number of active resource blocks in a channel bandwidth, an associated envelope tracking method, and an associated envelope tracking supply modulator circuit.

According to a first aspect of the present invention, an exemplary envelope tracking system is disclosed. The exemplary envelope tracking system includes an envelope tracking digital baseband (ETDBB) circuit, a digital-to-analog converter circuit, and an envelope tracking supply modulator (ETSM) circuit. The ETDBB circuit is arranged to perform envelope detection upon a transmit (TX) baseband signal to generate an envelope detection result, and generate a digital envelope input according to the envelope detection result. The digital-to-analog converter circuit is arranged to convert the digital envelope input into a supply envelope signal. The ETSM circuit is arranged to generate a modulated supply voltage according to the supply envelope signal, and output the modulated supply voltage to a power amplifier (PA). At least one of the ETDBB circuit and the ETSM circuit is further arranged to dynamically adjust gain compression (GC) of the PA in response to the number of active resource blocks (RBs) in a channel bandwidth.

According to a second aspect of the present invention, an exemplary envelope tracking method includes: in a digital domain, performing envelope detection upon a transmit (TX) baseband signal to generate an envelope detection result, and generating an envelope input according to the envelope detection result; performing digital-to-analog conversion upon the envelope input to generate a supply envelope signal; in an analog domain, generating a modulated supply voltage according to the supply envelope signal, and outputting the modulated supply voltage to a power amplifier (PA); and in at least one of the digital domain and the analog domain, performing gain compression (GC) control for dynamically adjusting GC of the PA in response to the number of active resource blocks (RBs) in a channel bandwidth.

According to a third aspect of the present invention, an exemplary envelope tracking supply modulator (ETSM) circuit is disclosed. The exemplary ETSM circuit includes an envelope tracking modulator (ETM) circuit and a gain compression (GC) control circuit. The ETM circuit is arranged to generate a modulated supply voltage according to a supply envelope signal, and output the modulated supply voltage to a power amplifier (PA). The GC control circuit is arranged to configure hardware of the ETSM circuit for dynamically adjusting GC of the PA in response to a number of active resource blocks (RBs) in a channel bandwidth.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
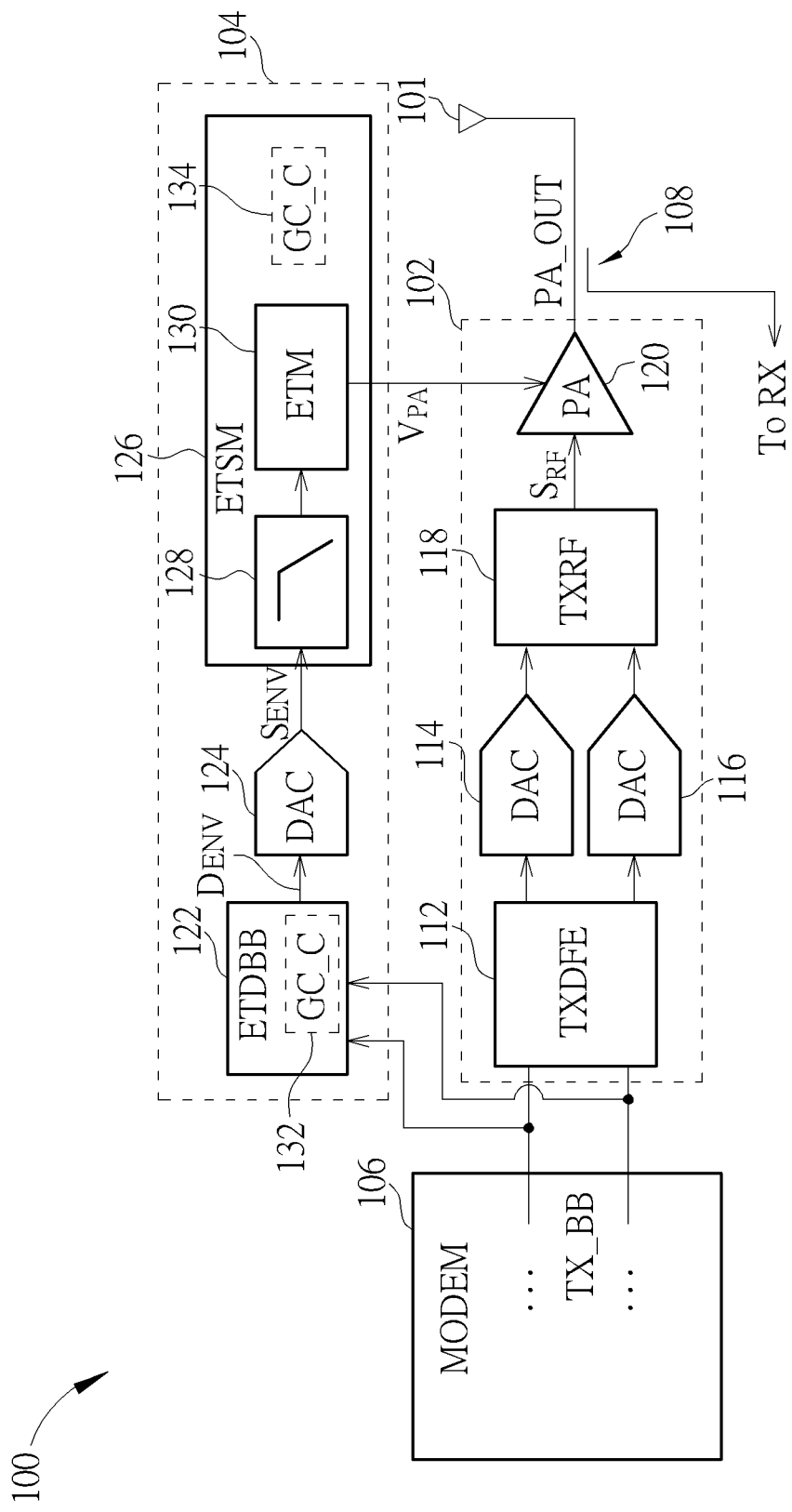
FIG. 1 is a block diagram illustrating a wireless communication system according to an embodiment of the present invention.

FIG. 1 is a block diagram illustrating a wireless communication system according to an embodiment of the present invention. For example, the wireless communication system 100 may be a 5G-NR system or a 4G-LTE system. As shown in FIG. 1, the wireless communication system 100 may include a transmit (TX) circuit 102, an envelope tracking system 104, and a modulator/demodulator circuit (labeled as "MODEM") 106. The modulator/demodulator circuit 106 may be apart of a digital baseband circuit. The TX circuit 102 is arranged to receive a TX baseband signal TX_BB from the modulator/demodulator circuit 102, generate a radio-frequency (RF) signal $S_{RF}$ according to the TX baseband signal TX_BB, and output the RF signal $S_{RF}$ to an antenna 101 via a power amplifier (PA) 120. For example, the TX baseband signal TX_BB is a digital signal, the RF signal $S_{RF}$ is an analog signal, and the TX circuit 102 may include a TX digital front end circuit (labeled as "TXDFE") 112, a digital-to-analog converter circuit (labeled by "DAC") 114 (in-phase (I) path), a digital-to-analog converter circuit (labeled by "DAC") 116 (quadrature (Q) path), a transmit RF circuit (labeled as "TXRF") 118, and the PA 120. For example, the TXDFE circuit 112 may include a digital pre-distortion block, an upsampling block (I-path), an upsampling block (Q-path), etc., and the TXRF circuit 118 may include an analog filter (I-path), an analog filter (Q-path), an upconversion circuit, etc.

The envelope tracking system 104 is arranged to derive a supply envelope signal $S_{ENV}$ from the baseband signal TX_BB, and generate a modulated supply voltage $V_{PA}$ according to the supply envelope signal $S_{ENV}$. For example, the TX baseband signal TX_BB is a digital signal, the supply envelope signal $S_{ENV}$ is an analog signal, and the envelope tracking circuit 104 may include an envelope tracking digital baseband circuit (labeled by "ETDBB") 122, a digital-to-analog converter circuit (labeled by "DAC") 124, and an envelope tracking supply modulator circuit (labeled by "ETSM") 126, where the ETSM circuit 126 may include an analog filter 128 and an envelope tracking modulator circuit (labeled by "ETM") 130. The ETDBB circuit 122 is a digital circuit operating in a digital domain, and is used to generate and output a digital envelope input $D_{ENV}$ to the following DAC circuit 124. The ETSM circuit 126 is an analog circuit operating in an analog domain, and is used to receive the supply envelope signal $S_{ENV}$ from the preceding DAC circuit 124. By way of example, but not limitation, the ETDBB circuit 122 may be implemented in a first chip, the ETSM circuit 126 may be implemented in a second chip, and the DAC circuit 124 may be implemented in any of the first chip and the second chip, depending upon actual design considerations. The supply envelope signal Saw is provided to the ETM circuit 130 through the analog filter 128. The ETM circuit 130 is arranged to generate the modulated supply voltage $V_{PA}$ according to the supply envelope signal $S_{ENV}$, and provide the modulated supply voltage $V_{PA}$ to the PA 120, where the modulated supply voltage $V_{PA}$ is not a fixed supply voltage. The PA 120 is powered by the modulated supply voltage $V_{PA}$ for amplifying the RF signal $S_{RF}$ to generate an output PA_OUT with the desired TX power. In addition, a receive (RX) circuit (not shown) may receive the output PA_OUT of the PA 120 via a coupler 108 for further processing.

In this embodiment, at least one of the ETDBB circuit 122 and the ETSM circuit 126 is further arranged to dynamically adjust gain compression (GC) of the PA 120 in response to the number of active resource blocks (RBs) in a channel bandwidth (e.g., CBW=20 MHz, 10 MHz, or other value). One of the factors that affect the GC of the PA 120 may be the modulated supply voltage $V_{PA}$. Hence, shifting the modulated supply voltage $V_{PA}$ by an offset is equivalent to adjusting the GC of the PA 120. Based on such observation, the proposed GC control design can achieve the objective of adjusting the GC of the PA 120 through directly/indirectly adjusting the modulated supply voltage $V_{PA}$ output from the envelope tracking system 104. For example, the ETDBB circuit 122 may include a GC control circuit (labeled by "GC_C") 132 for achieving the objective of dynamically adjusting the GC of the PA 120, and the ETSM circuit 126 may have no GC control functionality. For another example, the ETSM circuit 126 may include a GC control circuit (labeled by "GC_C") 134 for achieving the objective of dynamically adjusting the GC of the PA 120, and the ETDBB circuit 122 may have no GC control functionality. For yet another embodiment, the ETDBB circuit 122 may have the GC control circuit 132 and the ETSM circuit 126 may have the GC control circuit 134, such that the ETDBB circuit 122 and the ETSM circuit 126 may jointly adjust the GC of the PA 120. To put it simply, the proposed GC control design may be implemented in a digital domain, an analog domain, or both of the digital domain and the analog domain, depending upon actual design considerations. Further details of the proposed GC control design used for dynamically adjusting the GC of the PA 120 in response to the number of active resource blocks in the channel bandwidth will be described later with reference to the accompanying drawings.

Figure 2:
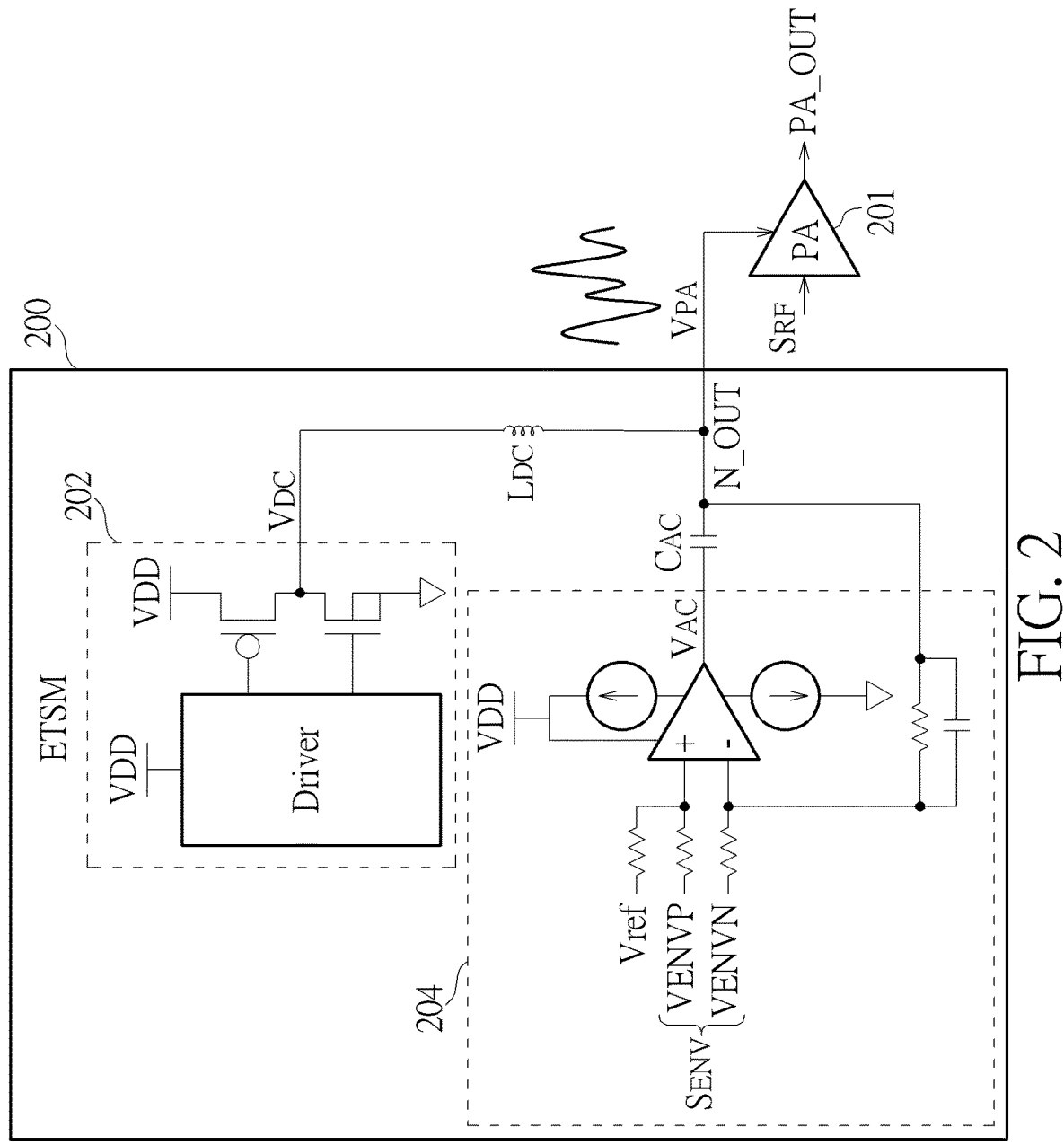
FIG. 2 is a diagram illustrating an envelope tracking supply modulator circuit according to an embodiment of the present invention.

FIG. 2 is a diagram illustrating an envelope tracking supply modulator circuit according to an embodiment of the present invention. The envelope tracking supply modulator circuit (labeled by "ETSM") 200 is arranged to generate a modulated supply voltage $V_{PA}$ according to a supply envelope signal $S_{ENV}$, and provide the modulated supply voltage $V_{PA}$ to a power amplifier (PA) 201. The PA 201 is powered by the modulated supply voltage $V_{PA}$ for amplifying an RF signal $S_{RF}$ to generate an output PA_OUT with the desired TX power. For example, the PA 120 shown in FIG. 1 may be the PA 201 shown in FIG. 2, and the ETSM circuit 104 (particularly, ETM circuit 130) may be implemented by the ETSM circuit 200 shown in FIG. 2. In this embodiment, the ETSM circuit 200 employs hybrid ETSM architecture, and therefore includes a DC-DC converter 202 and a linear amplifier (LA) 204. For example, the DC-DC converter 202 may be a switching converter such as a buck converter. The DC-DC converter 202 is arranged to generate and output a regulated direct current (DC) voltage $V_{DC}$ to an output port N_OUT of the ETSM circuit 200 via an inductor $L_{DC}$. It should be noted that the buck converter architecture shown in FIG. 2 is for illustrative purposes only, and is not meant to be a limitation of the present invention. That is, the present invention has no limitations on the implementation of the DC-DC converter 202.

The LA 204 is arranged to receive the supply envelope signal $S_{ENV}$ that is a differential signal consisting of a positive signal VENVP and a negative signal VENVN. As shown in FIG. 2, the LA 204 has a non-inverting input node (+) and an inverting input node (−), where the positive signal VENVP and a reference voltage Vref are coupled to the non-inverting input node (+), and the negative signal VENVN is coupled to the inverting input node (−). The reference voltage Vref may be set by a DAC output LADAC (e.g., LADAC=3.0V for a normal GC mode, and LADAC=2.5V for a GC-boost mode). The LA 204 generates and outputs an amplifier output $V_{AC}$ to the output port N_OUT of the ETSM circuit 200 via an alternating current (AC) coupling capacitor $C_{AC}$. The regulated DC voltage $V_{DC}$ and the amplifier output $V_{AC}$ jointly control the modulated supply voltage $V_{PA}$ of the PA 201. It should be noted that the linear amplifier architecture shown in FIG. 2 is for illustrative purposes only, and is not meant to be a limitation of the present invention. That is, the present invention has no limitations on the implementation of the linear amplifier 204.

Regarding a transmission between one user equipment and one base station, the number of active resource blocks in the channel bandwidth for the transmission may be decided by the base station in advance. Hence, after being informed of the number of active resource blocks in the channel bandwidth, the user equipment (particularly, envelope tracking system 104 of user equipment) may enable the proposed GC control design for dynamically adjusting the GC of the PA 120/201 in response to the number of active resource blocks in the channel bandwidth. For example, first GC is applied to the PA 120/201 through the modulated supply voltage $V_{PA}$ (e.g., $V_{PA}=V_{PA}-GC_1$) in response to a first number of active RBs in the channel bandwidth (e.g. CBW=20 MHz or 10 MHz), second GC is applied to the PA 120/201 through the modulated supply voltage $V_{PA}$ (e.g., $V_{PA}=V_{PA}-GC_2$) in response to a second number of active RBs in the channel bandwidth (e.g. CBW=20 MHz or 10 MHz), the second number of active RBs is smaller than the first number of active RBs, and the second GC is intentionally controlled to be higher than the first GC (i.e. $CG_2>CG_1$). For another example, each of the first number of active RBs and the second number of active RBs is smaller than the maximum number of RBs supported by the channel bandwidth. In other words, different gain compression settings may be applied to different partial-RB TX cases, respectively. Specifically, the proposed GC control design is applicable to all partial-RB TX cases for one particular channel bandwidth. In some embodiments of the present invention, the gain compression setting is set by $GC_1$ for a 12 RB TX case, the gain compression setting is set by $GC_2$ for a 50 RB TX case, the gain compression setting is set by $GC_3$ for a 100 RB TX case, and so forth.

Figure 3:
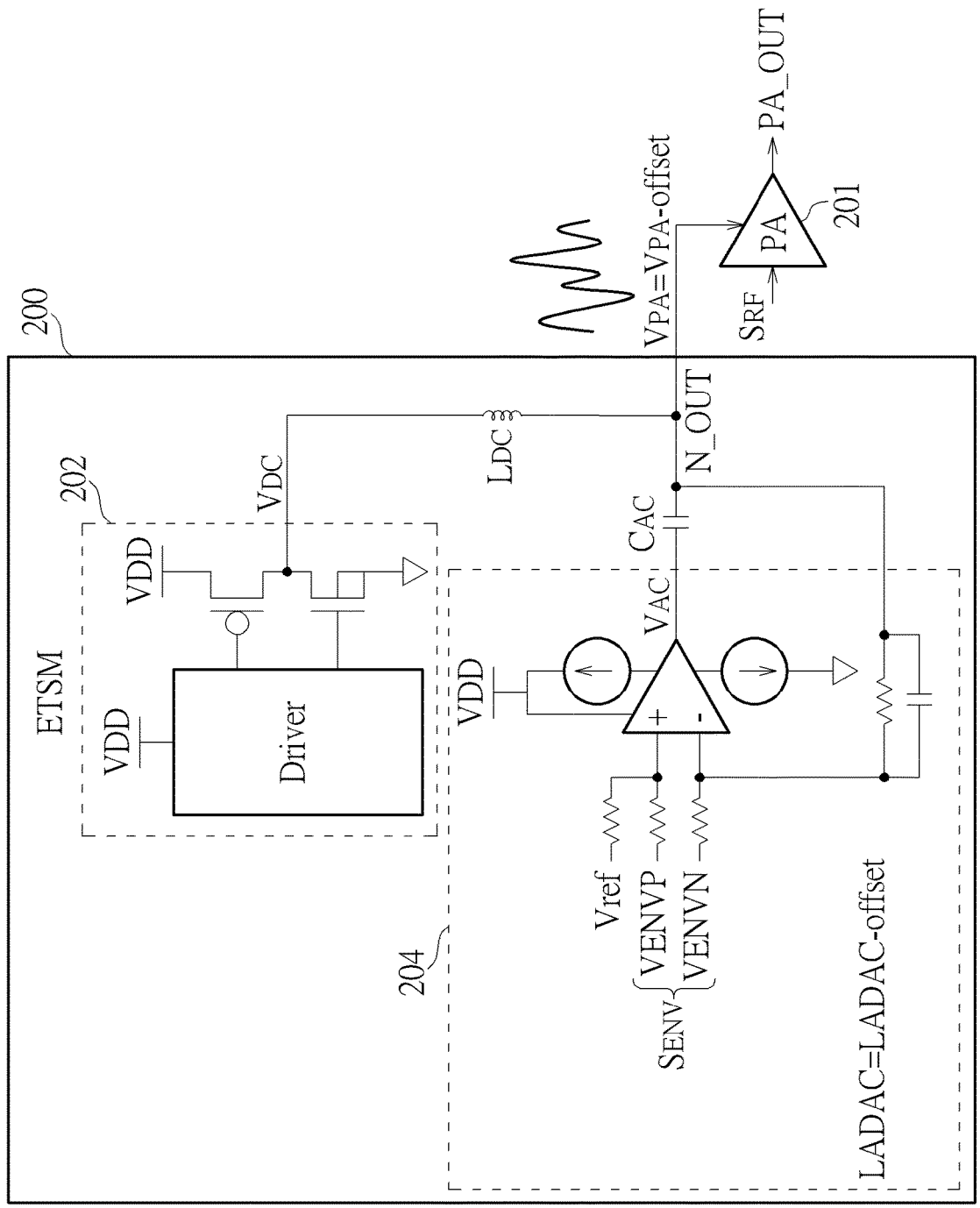
FIG. 3 is a diagram illustrating gain compression control achieved by configuring hardware of an envelope tracking supply modulator circuit according to an embodiment of the present invention.

Consider a case where the ETSM circuit 126 is responsible for adjusting the GC of the PA 120. Hence, the GC control circuit 134 is implemented in the ETSM circuit 126. In this embodiment, the GC control circuit 134 is arranged to configure hardware of the ETSM circuit 126 for achieving the objective of dynamically adjusting the GC of the PA 120. FIG. 3 is a diagram illustrating GC control achieved by configuring hardware of an ETSM circuit according to an embodiment of the present invention. Suppose that the ETSM circuit 200 may support a GC control function, and the ETSM circuit 126 may be implemented by the ETSM circuit 200. The reference voltage Vref applied to the non-inverting input node (+) of the linear amplifier 204 is set by the DAC output LADAC. Hence, the common mode voltage of the linear amplifier 204 is affected by the reference voltage Vref. To achieve higher PA gain compression, the hardware of the ETSM circuit 200 may be configured to reduce the DAC output LADAC by an offset, that is, LADAC=LADAC−offset. In this way, the modulated supply voltage $V_{PA}$ output from the linear amplifier 204 may be shifted by an offset, that is, $V_{PA}=V_{PA}$−offset. The value of the offset depends on the number of active RBs in the channel bandwidth. For example, the value of the offset may be negatively correlated with the number of active RBs in the channel bandwidth.

Figure 4:
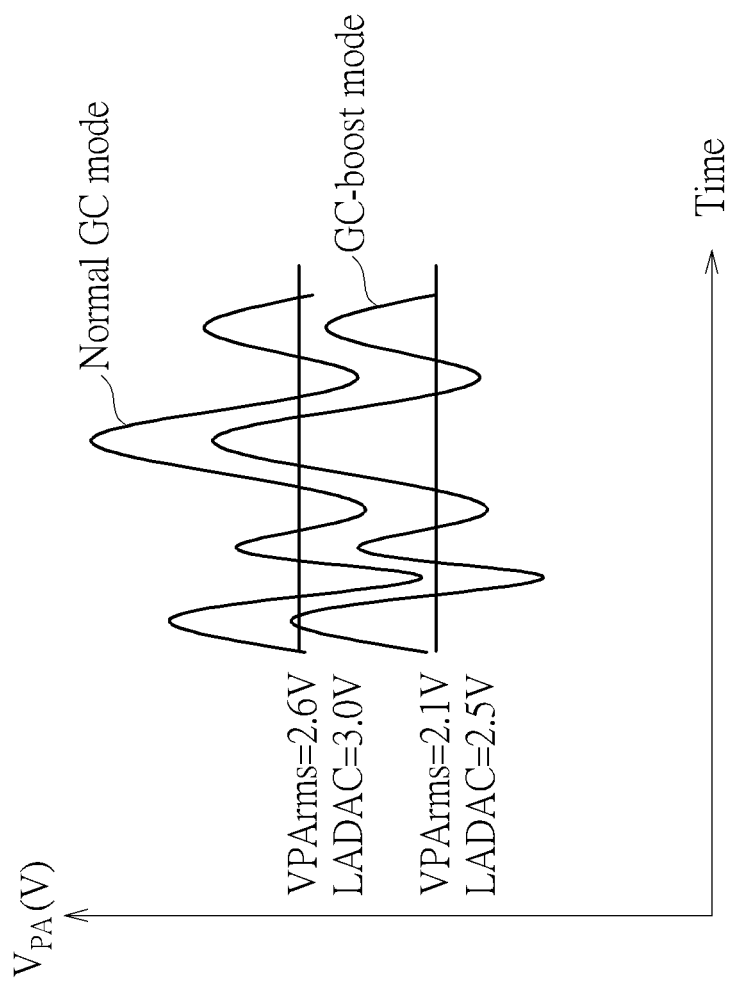
FIG. 4 is a diagram illustrating waveforms of the modulated supply voltage $V_{PA}$ under different gain compression settings according to an embodiment of the present invention.

FIG. 4 is a diagram illustrating waveforms of the modulated supply voltage $V_{PA}$ under different gain compression settings according to an embodiment of the present invention. When the PA 201 operates under a normal GC mode, the DC part VPArms (VPArms=2.6V) of the modulated supply voltage $V_{PA}$ is generated under the reference voltage Vref (which may be set by LADAC=3.0V). When the PA 201 operates under a GC-boost mode, the DC part VPArms (VPArms=2.6V−0.5V=2.1V) of the modulated supply voltage $V_{PA}$ is generated under the reference voltage Vref (which may be set by LADAC=3.0V−0.5V=2.5V). As shown in FIG. 4, the DC part VPArms of the modulated supply voltage $V_{PA}$ under the GC-boost mode is lower than the DC part VPArms of the modulated supply voltage $V_{PA}$ under the normal GC mode. Since the PA gain compression is inversely correlated with the modulated supply voltage $V_{PA}$, the PA gain compression under the GC-boost mode is higher than that under the normal GC mode.

It should be noted that configuring hardware of an ETSM circuit to achieve the objective of dynamically adjusting gain compression of a power amplifier is not limited to adjusting an LADAC value. In practice, any means capable of shifting a modulated supply voltage of the power amplifier through configuring hardware of the ETSM circuit can be adopted by the proposed gain compression control design.

Figure 5:
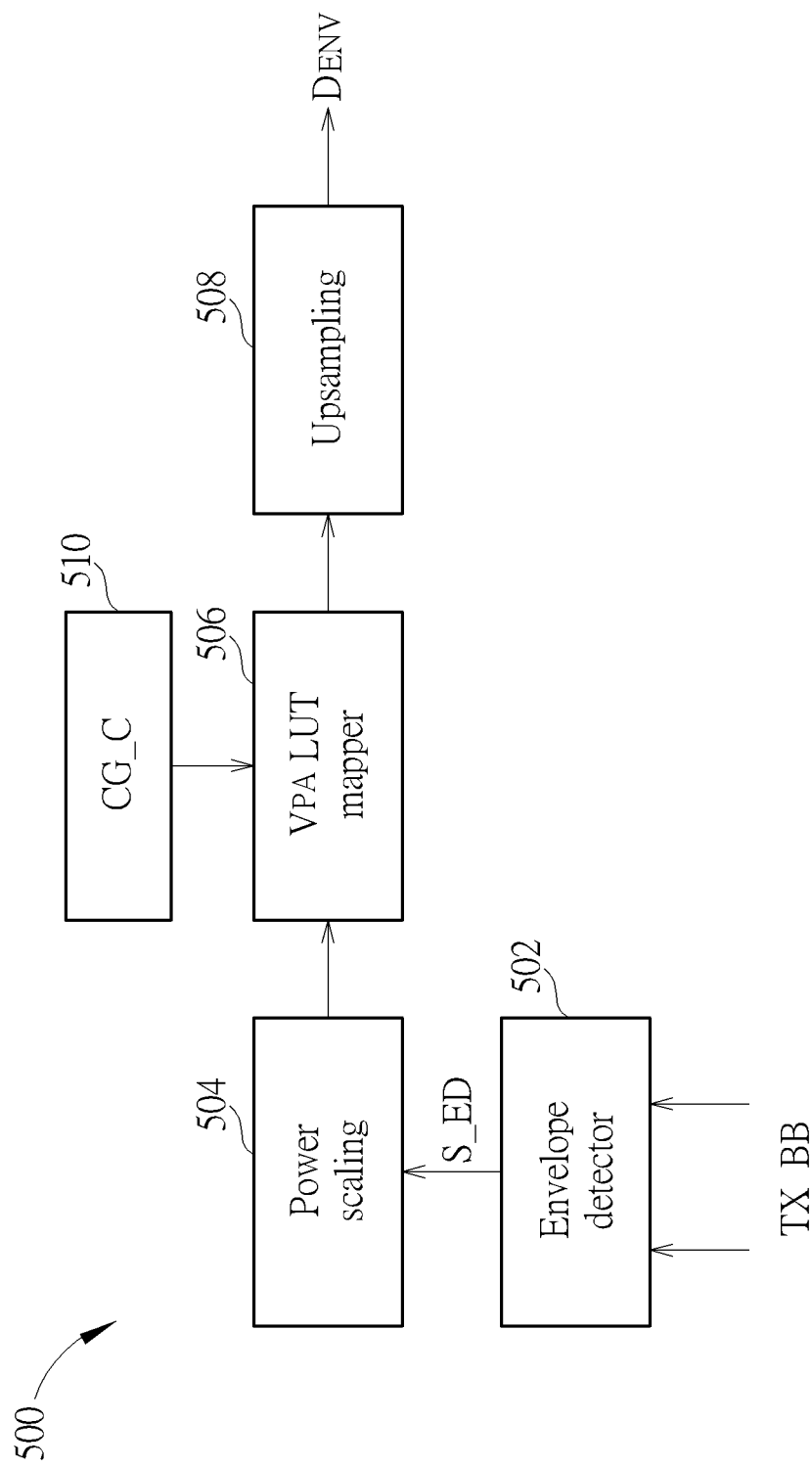
FIG. 5 is a diagram illustrating an envelope tracking digital baseband circuit according to an embodiment of the present invention.

Consider another case where the ETDBB circuit 122 is responsible for adjusting the GC of the PA 120. Hence, the GC control circuit 132 is implemented in the ETDBB circuit 122. FIG. 5 is a diagram illustrating an ETDBB circuit according to an embodiment of the present invention. The ETDBB circuit 122 shown in FIG. 1 may be implemented by the ETDBB circuit 500 shown in FIG. 5. In this embodiment, the ETDBB circuit 500 may include an envelope detector circuit (labeled by "envelope detector") 502, a power scaling circuit (labeled by "power scaling") 504, a $V_{PA}$ lookup mapper circuit (labeled by "$V_{PA}$ LUT mapper") 506, an upsampling circuit (labeled by "upsampling") 508, and a GC control circuit (labeled by "GC_C") 510. The envelope detector circuit 502 is arranged to perform envelope detection (e.g. peak detection) upon the TX baseband signal TX_BB to generate an envelope detection result S_ED from which the digital envelope input $D_{ENV}$ is derived. In this embodiment, the digital envelope input $D_{ENV}$ is derived from passing the envelope detection result S_ED through the power scaling circuit 504, the $V_{PA}$ lookup mapper circuit 506, and the upsampling circuit 508. Regarding the $V_{PA}$ lookup mapper circuit 506, it acts as an envelope shaping circuit for dealing with envelope shaping (which determines relationship between RF power and PA supply voltage), and may be implemented by a lookup table. For example, the envelope shaping provided by the $V_{PA}$ lookup mapper circuit 506 may employ an ISO-gain mapping algorithm. For another example, the envelope shaping provided by the $V_{PA}$ lookup mapper circuit 506 may employ a maximum-efficiency mapping algorithm. In this embodiment, the GC control circuit 510 is arranged to control the envelope shaping circuit (i.e. $V_{PA}$ lookup mapper circuit 506) to adjust the digital envelope input $D_{ENV}$, which in turns adjusts the supply envelope signal $S_{ENV}$ fed into the ETSM circuit 126 for achieving the objective of dynamically adjusting the GC of the PA 120.

Figure 6:
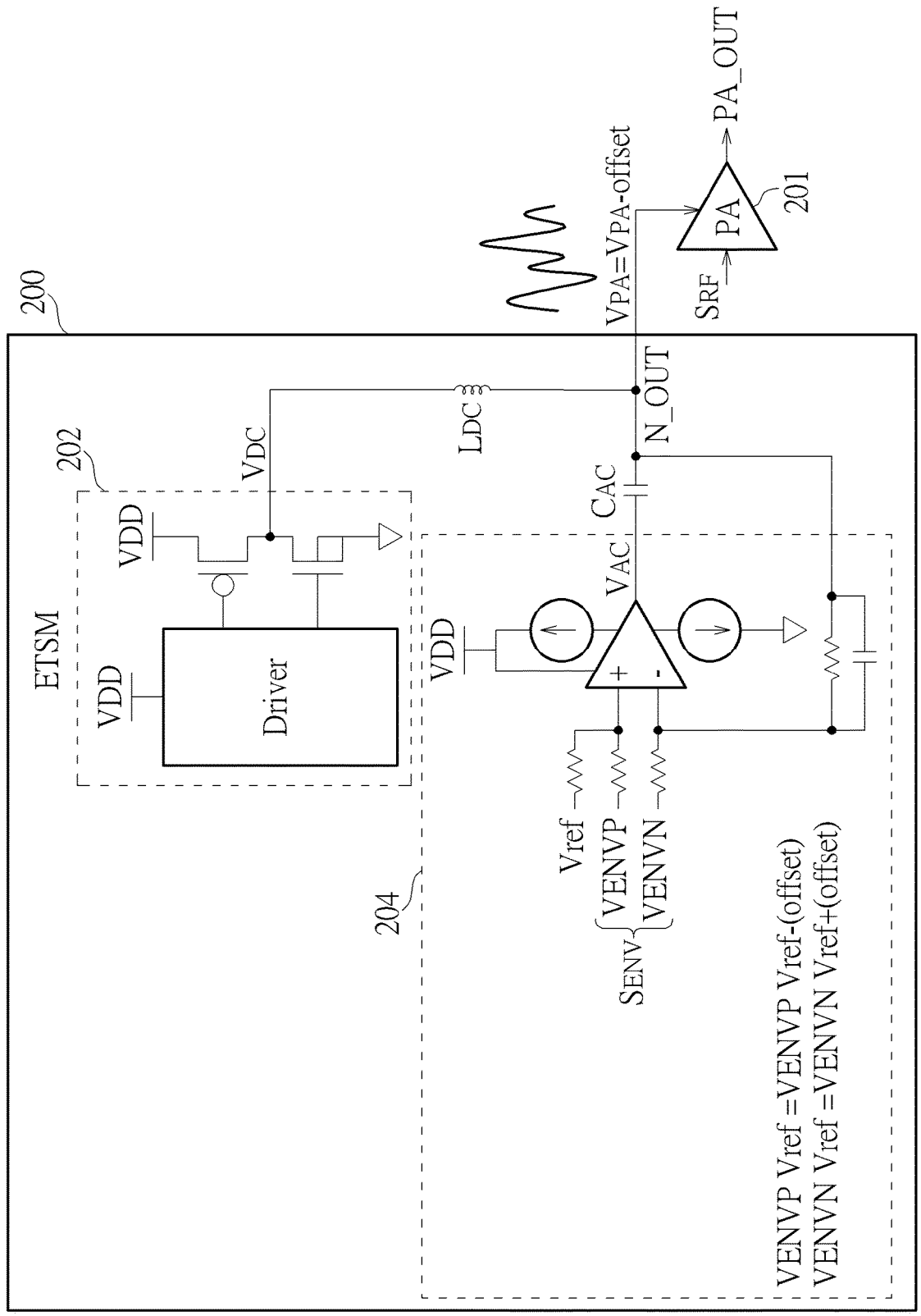
FIG. 6 is a diagram illustrating gain compression control achieved by adjusting envelope shaping performed at a $V_{PA}$ lookup mapper circuit according to an embodiment of the present invention.

FIG. 6 is a diagram illustrating GC control achieved by adjusting envelope shaping performed at a $V_{PA}$ lookup mapper circuit according to an embodiment of the present invention. Suppose that the ETSM circuit 200 may or may not support a GC control function, the ETSM circuit 126 may be implemented by the ETSM circuit 200, and the ETDBB circuit 122 may be implemented by the ETDBB circuit 500. The digital envelope input $D_{ENV}$ generated from the ETDBB circuit 500 (which operates in a digital domain) is converted into the supply envelope signal $S_{ENV}$ through digital-to-analog conversion (e.g. DAC circuit 124 shown in FIG. 1), and the supply envelope signal $S_{ENV}$ is processed by the ETSM circuit 126 (which operates in an analog domain) for setting the modulated supply voltage $V_{PA}$ of the PA 120/201. Hence, gain compression of the PA 120/201 can also be achieved by adjusting the supply envelope signal $S_{ENV}$ through the ETDBB circuit 500. To achieve higher PA gain compression, the GC control circuit 510 may adjust the $V_{PA}$ lookup mapper circuit 506 (particularly, envelope shaping performed at $V_{PA}$ lookup mapper circuit 506) for shifting DC levels of the positive signal VENVP and the negative signal VENVN of the supply envelope signal $S_{ENV}$ received by the ETSM circuit 200. As shown in FIG. 6, the DC level VENVP Vref of the positive signal VENVP is adjusted by an offset, that is, VENVP Vref=VENVP Vref−(offset), and the DC level VENVN Vref of the negative signal VENVN is adjusted by an offset, that is, VENVN Vref=VENVN Vref+ (offset). In this way, the modulated supply voltage $V_{PA}$ output from the linear amplifier 204 may be shifted by an offset, that is, $V_{PA}=V_{PA}$−offset. The value of the offset depends on the number of active RBs in the channel bandwidth. For example, the value of the offset may be negatively correlated with the number of active RBs in the channel bandwidth.

It should be noted that using an ETDBB circuit to achieve the objective of dynamically adjusting gain compression of a power amplifier is not limited to adjusting envelope shaping performed at a $V_{PA}$ lookup mapper circuit. In practice, any means capable of shifting a modulated supply voltage of the power amplifier through adjusting behaviors of an ETDBB circuit can be adopted by the proposed gain compression control design.

Compared to a full-RB TX case (e.g. 100 RB for CBW=20 MHz) under a specific GC mode (e.g. normal GC mode), a partial-RB TX case (e.g. 50 RB for CBW=20 MHz) under the same specific GC mode may have certain margin above the adjacent channel leakage ratio (ACLR) requirement. The PA efficiency of the partial-RB TX case can be improved at the expanse of the ACLR margin. Hence, the proposed GC control design may properly boost the PA gain compression for achieving better PA efficiency under the condition that the ACLR requirement is still met. For example, high PA gain compression is enabled for a low-RB (e.g. <6 RB) TX case, which may achieve additional 5%-10% system efficiency enhancement. Furthermore, the proposed GC control design can improve stability of hybrid ETSM architecture for low-RB ET-mode operation, and can be applied to an ET system with envelope shaping that is implemented on the basis of an ISO-gain mapping algorithm or a maximum-efficiency mapping algorithm.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An envelope tracking system comprising:
an envelope tracking digital baseband (ETDBB) circuit, arranged to perform envelope detection upon a transmit (TX) baseband signal to generate an envelope detection result, and generate a digital envelope input according to the envelope detection result;
a digital-to-analog converter circuit, arranged to convert the digital envelope input into a supply envelope signal; and
an envelope tracking supply modulator (ETSM) circuit, arranged to generate a modulated supply voltage according to the supply envelope signal, and output the modulated supply voltage to a power amplifier (PA);
wherein at least one of the ETDBB circuit and the ETSM circuit is further arranged to dynamically adjust gain compression (GC) of the PA in response to a number of active resource blocks (RBs) in a channel bandwidth;
wherein first GC is applied to the PA in response to a first number of active RBs in the channel bandwidth, second GC is applied to the PA in response to a second number of active RBs in the channel bandwidth, the second number of active RBs is smaller than the first number of active RBs, and the second GC is higher than the first GC.

2. The envelope tracking system of claim 1, wherein each of the first number of active RBs and the second number of active RBs is smaller than a maximum number of RBs supported by the channel bandwidth.

3. The envelope tracking system of claim 1, wherein the ETDBB circuit adjusts the GC of the PA.

4. The envelope tracking system of claim 3, wherein the ETDBB circuit comprises:
an envelope shaping circuit, arranged to perform envelope shaping; and
a GC control circuit, arranged to control the envelope shaping circuit for adjusting the digital envelope input, wherein the GC of the PA is adjusted in response to adjusting the digital envelope input.

5. The envelope tracking system of claim 4, wherein the envelope shaping employs an ISO-gain mapping algorithm.

6. The envelope tracking system of claim 4, wherein the envelope shaping employs a maximum-efficiency mapping algorithm.

7. The envelope tracking system of claim 1, wherein the ETSM circuit adjusts the GC of the PA.

8. The envelope tracking system of claim 7, wherein the ETSM circuit comprises:
an envelope tracking modulator (ETM) circuit, arranged to generate the modulated supply voltage; and
a GC control circuit, arranged to configure hardware of the ETSM circuit for adjusting the GC of the PA.

9. The envelope tracking system of claim 1, wherein the ETDBB circuit and the ETSM circuit jointly adjust the GC of the PA.

10. An envelope tracking method comprising:
in a digital domain, performing envelope detection upon a transmit (TX) baseband signal to generate an envelope detection result, and generating a digital envelope input according to the envelope detection result;
performing digital-to-analog conversion upon the digital envelope input to generate a supply envelope signal;
in an analog domain, generating a modulated supply voltage according to the supply envelope signal, and outputting the modulated supply voltage to a power amplifier (PA); and
in at least one of the digital domain and the analog domain, performing gain compression (GC) control for dynamically adjusting GC of the PA in response to a number of active resource blocks (RBs) in a channel bandwidth;
wherein first GC is applied to the PA in response to a first number of active RBs in the channel bandwidth, second GC is applied to the PA in response to a second number of active RBs in the channel bandwidth, the second number of active RBs is smaller than the first number of active RBs, and the second GC is higher than the first GC.

11. The envelope tracking method of claim 10, wherein each of the first number of active RBs and the second number of active RBs is smaller than a maximum number of RBs supported by the channel bandwidth.

12. The envelope tracking method of claim 10, wherein the GC control is performed in the digital domain.

13. The envelope tracking method of claim 12, wherein generating the digital envelope input according to the envelope detection result comprises:

performing envelope shaping; and
controlling the envelope shaping to adjust the digital envelope input, wherein the GC of the PA is adjusted in response to adjusting the digital envelope input.

14. The envelope tracking method of claim 13, wherein the envelope shaping employs an ISO-gain mapping algorithm.

15. The envelope tracking method of claim 13, wherein the envelope shaping employs a maximum-efficiency mapping algorithm.

16. The envelope tracking method of claim 10, wherein the GC control is performed in the analog domain.

17. The envelope tracking method of claim 16, wherein generating the modulated supply voltage according to the supply envelope signal comprises:
generating the modulated supply voltage by an envelope tracking supply modulator (ETSM) circuit; and
configuring hardware of the ETSM circuit for adjusting the GC of the PA.

18. The envelope tracking method of claim 10, wherein the GC control is jointly performed in the digital domain and the analog domain.

19. An envelope tracking supply modulator (ETSM) circuit, comprising:
an envelope tracking modulator (ETM) circuit, arranged to generate a modulated supply voltage according to a supply envelope signal, and output the modulated supply voltage to a power amplifier (PA); and
a gain compression (GC) control circuit, arranged to configure hardware of the ETSM circuit for dynamically adjusting GC of the PA in response to a number of active resource blocks (RBs) in a channel bandwidth;
wherein first GC is applied to the PA in response to a first number of active RBs in the channel bandwidth, second GC is applied to the PA in response to a second number of active RBs in the channel bandwidth, the second number of active RBs is smaller than the first number of active RBs, and the second GC is higher than the first GC.

20. The ETSM circuit of claim 19, wherein each of the first number of active RBs and the second number of active RBs is smaller than a maximum number of RBs supported by the channel bandwidth.

* * * * *